United States Statutory Invention Registration [19]

[11] Reg. Number: H330

Burich et al. [43] Published: Sep. 1, 1987

[54] PERSONNEL GROUNDING SYSTEM TESTER

[75] Inventors: Lawrence R. Burich; Thomas O. Balcer, both of San Jose, Calif.

[73] Assignee: The United States of America as represented by the Secretary of the Navy, Washington, D.C.

[21] Appl. No.: 627,133

[22] Filed: Jul. 2, 1984

[51] Int. Cl.[4] ..... G01R 31/02; G08B 21/00; H02H 3/20

[52] U.S. Cl. ..... 324/500; 361/90; 340/649

[58] Field of Search ..... 324/51, 62, 64, 65 R; 340/649, 650; 361/42, 90, 212, 220; 128/734

[56] References Cited

U.S. PATENT DOCUMENTS

| | | | |
|---|---|---|---|
| Re. 28,394 | 4/1975 | Point | 324/51 X |
| 2,247,875 | 7/1941 | Ellis | 128/734 |
| 3,376,502 | 4/1968 | Rink | 324/51 |
| 3,758,855 | 9/1973 | Meyer | 324/51 A |
| 3,949,736 | 4/1976 | Vrana et al. | 128/734 |
| 3,963,981 | 6/1981 | Vis | 324/51 |
| 4,016,488 | 4/1977 | Stevens | 340/649 X |
| 4,394,615 | 7/1983 | Rocci, Jr. | 324/51 |
| 4,558,309 | 12/1985 | Antonevich | 324/51 X |
| 4,580,188 | 4/1986 | Brown et al. | 324/51 X |

*Primary Examiner*—Stephen C. Buczinski
*Assistant Examiner*—Linda J. Wallace
*Attorney, Agent, or Firm*—R. F. Beers; C. D. B. Curry; W. C. Daubenspeck

[57] ABSTRACT

Apparatus for on-site testing of wrist straps or shoe straps of the type used to prevent the buildup of electrostatic charges on the body and clothing of a worker engaged in handling charge-sensitive electronic devices. The worker wearing a grounding strap connects the grounding strap to a terminal on the tester and touches a touch pad on the apparatus. The tester incorporates the resistance of the grounding strap and the worker wearing the strap into a voltage divider. If the incorporated resistance is within acceptable limits, an indicating lamp is lighted to show that the grounding strap is working properly. An indicating signal may also be coupled to a computer for automatic recordkeeping.

8 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PERSONNEL GROUNDING SYSTEM TESTER

BACKGROUND OF THE INVENTION

This invention relates in general to electrical testing apparatus and, in particular, to apparatus for testing personnel grounding systems which are used in the manufacture and handling of static-sensitive electronic devices.

Many advanced electronic devices may be damaged by electrostatic discharge of triboelectric charges on personnel engaged in manufacturing and handling the devices. An electrostatic discharge of 100–150 volts may be sufficient to cause dielectric breakdown in a chargesensitive device such as a complementary metal-oxide-semiconductor (CMOS) integrated circuit. These devices may be exposed to electrostatic charges of several thousand volts which can be generated by the movement of personnel handling the devices.

Consequently, workers involved in the manufacture or assembling of charge-sensitive devices may be required to wear grounding circuits to prevent the buildup of the electrostatic charges on their bodies and clothing. Typically the worker will wear a strap attached to his wrist which will electrically connect his body to a grounding terminal through a large resistance, for example one megohm resistance. This wrist strap discharges the electrostatic buildup before it reaches potentially damaging levels. The resistor is a safety feature isolating the worker from ground in case he comes in contact with high voltage. Shoe/ankle straps are also used to discharge static electric charges through conductive floor plates.

Because the wires of the grounding straps undergo a great amount of movement, they are prone to failure and must be checked periodically to verify that they are operating properly. Typically, they are sent to a testing area where their operation is certified. This, of course, involves a great deal of time and expense. In the past, with a certification period of three months, a failure rate of 10–20 percent has been found in this type of equipment. It is apparent that charge-sensitive devices may be damaged through use of these defective grounding straps and that frequent certification on a weekly or even daily basis is advisable.

SUMMARY OF THE INVENTION

It is therefore an object of the present invention to provide for frequent testing of the personnel grounding systems.

Another object is to provide apparatus for testing personnel grounding systems which is simple to use and provides a GO/NO GO answer to the operability of the grounding system.

Another object is to provide apparatus for testing personnel grounding systems which allows frequent on-site testing.

These and other objects are provided by an on-site testing device in which a worker wearing a grounding strap simply places the connector of the grounding strap in a jack on the front panel of the testing device and touches a touchpad on the front panel with his finger. The testing device incorporates the resistance of the grounding strap and the person wearing the grounding strap into a resistive voltage divider network. If the incorporated resistance is within acceptable limits, an indicating lamp is lighted to show the operator that the grounding system is working properly. An indicating signal may also be coupled to a computer input for automatic recordkeeping.

Other advantages and features of the present invention will become apparent as the same becomes better understood from the following description in conjunction with the accompanying drawings wherein:

DESCRIPTION OF THE PREFERRED EMBODIMENT

Figure 1:
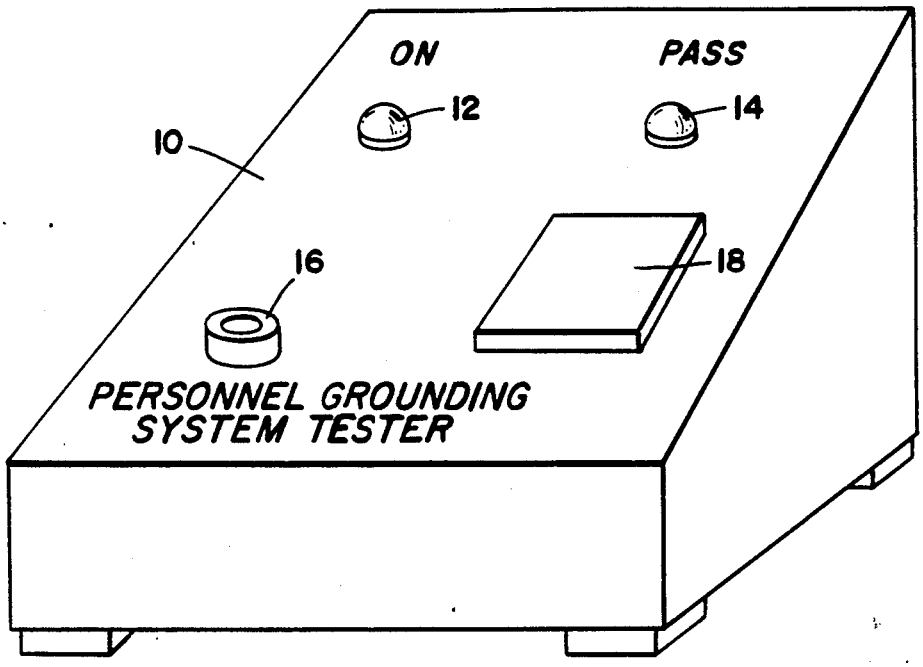
FIG. 1 is a perspective view of a personnel grounding system tester showing the face panel and foot plate.

Referring now to the drawings, the personnel grounding system tester may be housed in a portable unit as illustrated in FIG. 1. The test unit has a face panel 10 having a indicator light 12 for indicating to an operator that primary power and logic power for the instrument's curcuitry is activated. A second indicator light 14 is provided to indicate when the tested resistance of the system is within specified limits. A connector 16 (such as a banana jack) is provided to connect the grounding connector from a grounding device such as a wrist strap to the test unit. A footplate 17 may also be provided for electrically coupling a shoe strap grounding device to the test unit. A touchpad 18 is provided so that an operator wearing the wrist strap or foot strap may simply touch the pad 18 complete a circuit between the connector 16 and the touch pad 18 through the body of the operator. If the resistance of this circuit (the grounding strap, the connection of the grounding strap to the operator, and the operator) is within acceptable limits, the indicator light 14 will be lighted indicating that the grounding device has passed the certification test.

Figure 2:
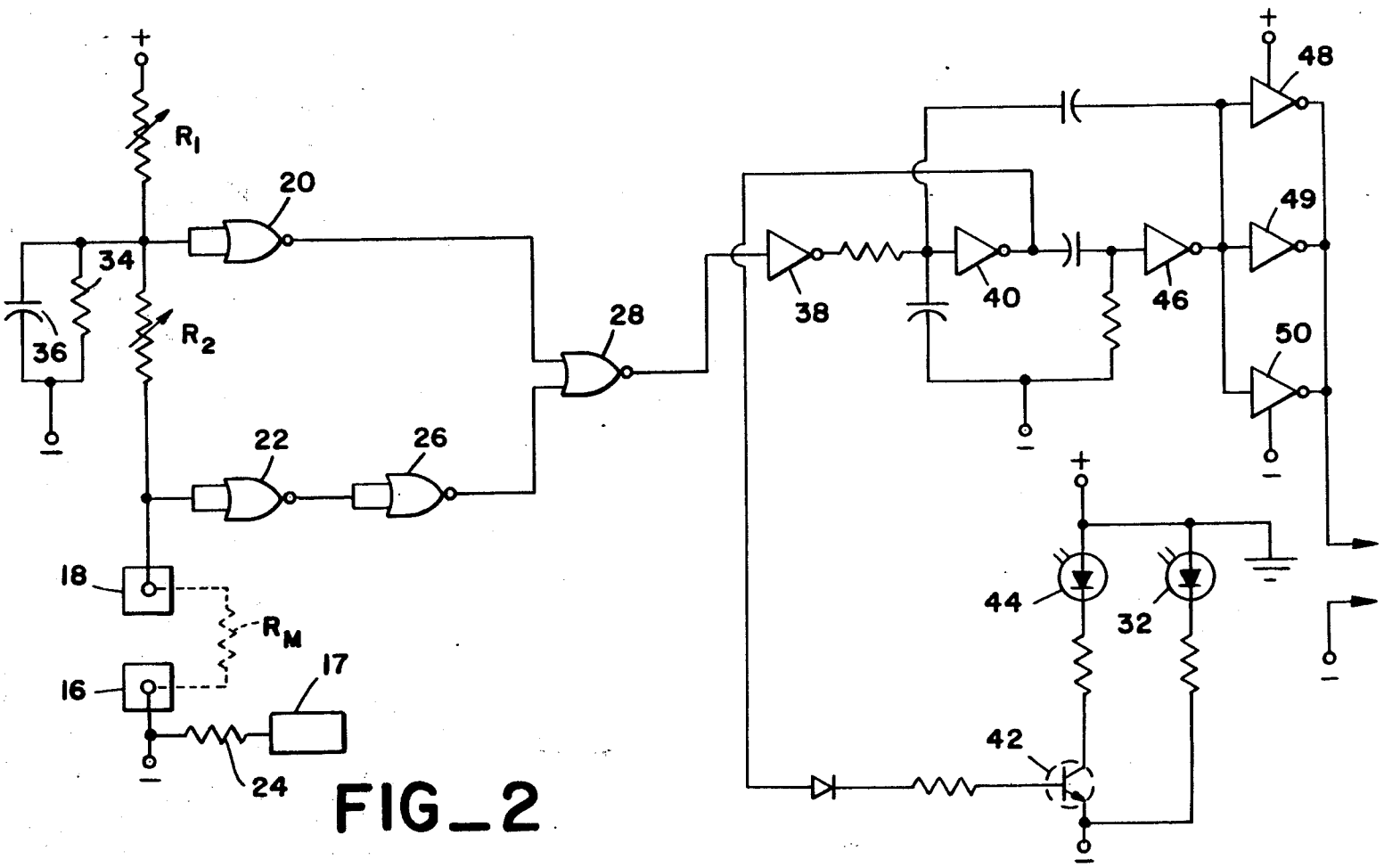
FIG. 2 is a schematic diagram illustrating the details of the circuitry embodying the invention.

The preferred embodiment is implemented with complementary metaloxide semiconductor (CMOS) circuitry as shown in FIG. 2. Primary power (120 vAC) is coupled to a 12 vDC power supply (not shown) which provides the supply voltage for the integrated circuits. A pair of two input NOR gates 20 and 22, which have their two inputs coupled together so that they function as inverters, are coupled to a voltage divider network. The voltage divider network includes a first variable resistor R1 coupled between the positive terminal of the DC supply and the input to NOR gate 20 and a second variable resistor R2 coupled between the input to NOR gate 20 and the input to NOR gate 22. The input to NOR gate 22 is further coupled to the touch pad 18. The banana jack connector 16 is coupled to the negative terminal of the DC supply. The footplate 17 is coupled to the negative terminal of the DC supply through a resistance 24 (47K in this embodiment). The output of NOR gate 22, inverted by a third twoinput NOR gate 26, and the output NOR gate 20, are coupled to the two inputs of a fourth two-input NOR gate 28.

The DC power supply is also coupled across a light emitting diode 32 to provide an indication when the DC supply is energized. A resistor 34 and capacitor 36 functioning as an AC filter are coupled in parallel between the input to NOR gate 20 and the negative terminal of the DC supply.

In the preferred embodiment, the output of NOR gate 28 is coupled to provide a light emitting diode indication of the GO/NO GO status and also to provide a computer input of the status. In this embodiment, the output of NOR gate 28 is coupled through inverters 38 and 40. The output of inverter 40 is coupled to a transistor 42 to drive a light-emitting diode 44. The output of inverter 40 is also differentiated to form a pulse suitable for input to a computer, and then coupled through inverters 46, 48, 49 and 50 to provide increased current for input to a computer for automatic monitoring and recordkeeping of the certification test.

Turning now to the operation of the circuit of FIG. 2, the first criteria for the values of R1 and R2 is that their combined resistance will determine the maximum current flowing through the voltage divider and thus maximum current flowing through the body of the operator when the operator is in the circuit between touchpad 18 and jack 16. Thus R1 and R2 are chosen in order to limit the maximum current to a safe value such as 1–2 μamp. A combined value of R1 and R2 of 10 megaohms or greater is suitable with 12 vDC supply. The values of R1 and R2 are also selected to provide a "pass" window; that is, a minimum value and maximum value of measured resistance $R_M$ (shown in phantom) between touchpad 18 and jack 16 which will generate a pass signal (i.e. light LED 44). The value of R1 plus R2 controls the maximum pass value and the ratio of R1 to R2 plus $R_M$ controls the minimum pass value. The supply voltage of 10–15 v DC was selected to help breakdown skin resistance. In an operative embodiment R1 was set between 3.3 megohm and 8.3 megohm and R2 was a variable resistor having a 2–7 megohm range. An acceptable value for $R_M$ was between approximately 0.5 megohm and 10 megohms.

The testing device is calibrated to provide a minimum pass resistance by placing a calibration resistance, $R_C$, of the desired minimum value between touchpad 18 and jack 16. The resistance R2 is then adjusted until the pass indicator light 30 goes off. Accordingly, resistances of the calibration value or less will not generate a pass signal. A similar procedure can be followed to select a maximum acceptable value for $R_M$. It should be noted that R1 must be greater than R2 and that the calibration is advisable because the switching voltages of NOR gates 20 and 22 may vary from device to device.

In operation, the resistances R1 and R2 of the voltage divider provides input to the NOR gates 20 and 22 as shown in Table II where $R_M$ is resistance between the touchpad 18 and jack 16.

| $R_M$ | Input To Gate 20 | Input To Gate 22 | Pass/Fail |
|---|---|---|---|
| Acceptable | High | Low | Pass |
| $R \geqq$ maximum | High | High | Fail |
| $R \leqq$ minimum | Low | Low | Fail |

If the resistance $R_M$ is acceptable, the inputs to gate 20 will be high and gate 22 will be low which will produce a high signal at the output of gate 28. If the resistance $R_M$ is greater than the maximum, both the inputs to gate 20 and gate 22 will be high which will produce a low signal at the output of gate 28. If the resistances $R_M$ is less than the minimum, the input to gates 20 and 22 will both be low which will produce a low at the output of gate 28.

Obviously many modifications and variations of the present invention are possible in the light of the above teachings. It is therefore to be understood that within the scope of the appended claims the invention may be practiced otherwise than as specifically described.

What is claimed is:

1. Apparatus for testing a personnel grounding system of the type used to prevent the buildup of electrostatic charges on the body and clothing of a worker engaged in the handling of charge-sensitive electronic devices, said personnel grounding system including first connector means electrically coupled to the body of said worker and means for coupling said first connector means through a safety resistance to a grounding connector means, said grounding connector means being adapted to connected to a grounding terminal which is coupled to earth ground, said apparatus determining whether the resistance of said personnel grounding system, measured from said first connector means through the body of said worker to said grounding connector means, is between two preselected values and providing an indicating signal when the resistance of said personnel grounding system is between said two preselected values, said apparatus comprising:

(a) a voltage source having a first polarity and a second polarity;

(b) a test connector for receiving said grounding connector means, said first polarity of said voltage source being connected to said test connector;

(c) a first resistance, said first resistance being coupled to the second polarity of said voltage source;

(d) a conductive pad disposed so that it may be touched by said worker while being electrically coupled to said first connector means;

(e) a second resistance coupled between said first resistance and said conductive pad, said second resistance being less than the first resistance;

(f) first voltage sensing means coupled between said first and second resistances for providing a high output when a voltage at its input is above a selected voltage and low output when a voltage at its input is below said selected voltage;

(g) second voltage sensing means coupled between said second resistance and said conductive pad for providing a high output when a voltage at its input is above a selected voltage and a low output when a voltage at its input is below a selected voltage;

(h) means for providing an indicating signal when said first voltage sensing means provides a high output signal and said second voltage sensing means provides a low output signal; and (i) the values of said first and second resistances being selected to provide a voltage at the input of said first voltage sensing means which is above said selected voltage and a voltage at the input of said second voltage sensing means which is below said selected voltage when the value of a resistance measured between said test connector and said conductive pad is between said two preselected values.

2. Apparatus as recited in claim 1 wherein said first voltage sensing means is a first NOR gate operating as an inverter and said second voltage sensing means is a second NOR gate operating as inverter.

3. Apparatus as recited in claim 2 wherein said means for providing an indicating signal includes a light emitting diode.

4. Apparatus as recited in claim 3 wherein said means for providing an indicating signal includes:

(a) an inverter coupled to receive the output signal from said second NOR gate and providing an inverted signal;

(b) a two-input NOR gate having a first input coupled to the output of said first NOR gate and having a second input coupled to the inverted signal from the inverter, said two-input NOR gate having an output coupled to drive said light emitting diode.

5. Apparatus as recited in claim 4 wherein the output of said two-input NOR gate is further coupled to form a pulse for input to a computer for automatic monitoring and recordkeeping.

6. Apparatus as recited in claim 5 further including a foot plate electrically coupled to said test connector.

7. Apparatus as recited in claim 1 wherein said first resistance and said second resistances are variable resistances.

8. Apparatus as recited in claim 4 wherein said first resistance and said second resistances are variable resistances.

* * * * *